United States Patent
Fossey et al.

(10) Patent No.: US 9,163,334 B1
(45) Date of Patent: Oct. 20, 2015

(54) ACTUATORS BASED ON UNBALANCED MOMENTS OF INERTIA

(75) Inventors: Stephen A. Fossey, Framingham, MA (US); Barry S. Decristofano, Plympton, MA (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 960 days.

(21) Appl. No.: 13/343,933

(22) Filed: Jan. 5, 2012

Related U.S. Application Data

(60) Provisional application No. 61/563,040, filed on Nov. 23, 2011.

(51) Int. Cl.
| | |
|---|---|
| *D02J 1/22* | (2006.01) |
| *D01D 5/12* | (2006.01) |
| *D01D 5/30* | (2006.01) |
| *D01D 5/34* | (2006.01) |

(Continued)

(52) U.S. Cl.
CPC .. *D01D 5/12* (2013.01); *D01D 5/16* (2013.01); *D01D 5/30* (2013.01); *D01D 5/32* (2013.01); *D01D 5/34* (2013.01); *D01F 8/04* (2013.01); *D01F 8/06* (2013.01); *D01F 8/10* (2013.01); *D01F 8/12* (2013.01); *D01F 8/14* (2013.01); *D01F 8/16* (2013.01)

(58) Field of Classification Search
CPC ............ D01D 5/12; D01D 5/15; D01D 5/30; D01D 5/32; D01D 5/34; D01D 5/36; D01F 8/04; D01F 8/06; D01F 8/12; D01F 8/14; D01F 8/16; D02J 1/22

USPC ............ 264/172.11, 172.12, 172.13, 172.14, 264/172.15, 172.17, 172.18, 210.8
See application file for complete search history.

(56) References Cited

U.S. PATENT DOCUMENTS

| | | |
|---|---|---|
| 3,505,164 A | 4/1970 | Oppenlander |
| 3,509,013 A | 4/1970 | Oppenlander |

(Continued)

FOREIGN PATENT DOCUMENTS

| | | | |
|---|---|---|---|
| JP | 2006241613 A | * | 9/2006 |

OTHER PUBLICATIONS

Stuart, I.M., and Holcombe, B.V., "Heat Transfer Through Fiber Beds by Radiation with Shading and Conduction", Textile Research Journal, vol. 54, 1984, pp. 149-157.

(Continued)

*Primary Examiner* — Leo B Tentoni
(74) *Attorney, Agent, or Firm* — Roger C. Phillips

(57) ABSTRACT

Methods and computer-readable mediums are provide that, in some embodiments maximize bending of an actuator and, in other embodiments, minimize bending of the actuator. For example, in one embodiment, a method is provided that acquires a first ratio of a modulus of inertia for a first component to a Young's Modulus for the first component. The method also acquires a second ratio of a modulus of inertia for a second component to a Young's Modulus for the second component. Thereafter, the method provides an actuator (which includes the first component and second component). The actuator has a cross-sectional shape such that the first ratio substantially equal to said second ratio. In various embodiments of the invention, the actuator is spun fibers formed into batting and used as insulation, or may form an active element of a thermostat.

12 Claims, 9 Drawing Sheets

(51) Int. Cl.
*D01F 8/04* (2006.01)
*D01F 8/12* (2006.01)
*D01F 8/14* (2006.01)
*D01F 8/16* (2006.01)
*D01F 8/10* (2006.01)
*D01D 5/32* (2006.01)
*D01F 8/06* (2006.01)
*D01D 5/16* (2006.01)

(56) References Cited

U.S. PATENT DOCUMENTS

| | | | |
|---|---|---|---|
| 3,533,904 A | | 10/1970 | Jurkiewitsch |
| 3,568,249 A | * | 3/1971 | Matsui ............ 264/172.12 |
| 4,211,819 A | | 7/1980 | Kunimune et al. |
| 5,702,658 A | * | 12/1997 | Pellegrin et al. ...... 264/172.14 |
| 6,074,590 A | * | 6/2000 | Gownder ............ 264/172.12 |
| 6,312,784 B2 | | 11/2001 | Russell et al. |
| 8,349,438 B2 | | 1/2013 | Laib et al. |
| 8,389,100 B2 | | 3/2013 | Rock et al. |

OTHER PUBLICATIONS

Farnworth, B., "Mechanisms of Heat Flow Through Clothing Insulation", Textile Research Journal, vol. 53, 1983, pp. 717-724.

Dent, R. W., Donovan, J. G., Skelton, J., and Fossey, S. "Development of Synthetic Down Alternatives", Natick/TR-86/021L, Apr. 1984.

Dent, R. W., Donovan, J. A, Skelton, J., and Fossey, S. "Development of Synthetic Down Alternatives Phase II", Natick/TR-87/004L, Jan. 1986.

Santee, W. R. "A Simplified Modeling Approach for Estimating Heat Loss during Cold Exposure" U. S. Army Research Institute of Environmental Medicine Report 19960805 091, Jun. 1996.

Lacks and Rutlege, Mechanisms for Axial thermal Contraction in Polymer Crystals: Polyethylene vs Isotactic Polypropylene, vol. 49, No. 17, pp. 2881-2888, Jan. 1994.

S. Timoshenko, "Analysis of Bi-Metal Thermostats", Scientific Paper 178, Westinghouse Research Laboratory, Sep. 1925, pp. 233-255.

Lovinger, Lotz, Davis and Padden, Jr., "Structure and Defects in Fully Syndiotactic Polypropylene", Macromolecules, Apr. 1993, pp. 3484-3503.

Alici and Nuynh, "Predicting Force Output of Trilayer Polymer Actuators", www.sciencedirect.com, Apr. 2006.

Fossey and Du Plessis, "Variable Loft Thermal Insulation for Temperature Adaptive Clothing", Solutions and Opportunities for the Safety and Protective Fabrics Industry, conference proceedings of the 4th International Conference on Safety & Protective Fabrics, pp. 85-102, Pittsburgh, PA, Oct. 26-27, 2004.

Fossey, Gilbert and Hunt, "Variable Loft Thermal Insulation", Proceedings of the AATCC 2006 International Conference, p. 478-482, Atlanta, GA, 2006.

Uehara, Yamazaki and Kanamoto, "Tensile Properties of Highly Syndiotactic Polypropylene", Polymer, vol. 37 No. 1, Mar. 1995, pp. 57-64.

Slepyan, Ryvkin and Fuchs, "Temperature Insensitive Curved Bimetal Elements", Acta Astronautica, vol. 37, Jan. 1995, pp. 95-103.

Shapiro and Smela, "Bending Actuators with Maximum Curvature and Force and Zero Interfacial Stress", Journal of Intelligent Material Systems and Structures, vol. 18, Feb. 2007, pp. 181-186.

Aklonis and MacKnight (1983), Introduction to Polymer Viscoelasticity, pp. 57-62, New York, NY: Wiley & Sons, Inc.

Fossey, Decristofano, Welsh, Perry and Archambault, "Temperature Adaptive 'Smart' Thermal Insulation Based on Multicomponent Fiber Spinning", Army Science Conference, Orlando, FL, Session G. Dec. 2010. GP-16.

Decristofano, Fossey, Welsh, Perry and Archambault, "Temperature Adaptive Insulation Based on Multi-Component Fibers of Various Cross-sections", MRS Fall Meeting, Dec. 2010, pp. 1-6.

Lacks and Rutledge, "Molecular Basis for the Anisotropic Transverse Thermal Expansion of Syndiotactic Polypropylene", Macromolecules Jun. 1995, pp. 5789-5792.

Wang and Cross, "Performance Analysis of Piezoelectric Cantilever Bending Actuators", Ferroelectrics, vol. 215, Mar. 1998, pp. 187-213.

\* cited by examiner

Temperature Response of Battings

ACTUATORS BASED ON UNBALANCED MOMENTS OF INERTIA

CROSS-REFERENCE TO RELATED APPLICATIONS

This application claims benefit of under 35 U.S.C. §119(e) of U.S. Provisional Patent Application No. 61/563,040, filed Nov. 23, 2011, which application is incorporated herein by reference in its entirety.

BACKGROUND

1. Field of the Invention

Embodiments of the present invention generally relate to actuators and more specifically to tailoring the moments of inertia of at least two components, of the actuator, to enhance or suppress bending.

2. Description of the Related Art

It has long been known that two sheets of metal with different coefficients of thermal expansion ("CTE") will bend with changes in temperature. The traditional approach to this technology is illuminated by the "bi-metallic spring." The general relationship for when the two metals (i.e., in a bi-metallic strip) are of the same thickness is analyzed in Timoshenko, S., Analysis of Bi-metal Thermostats, J. Opt. Soc. Am. (1925), 11(2), pp. 233-255 (hereinafter "Timoshenko").

Timoshenko analyzed the bending of a bi-metal thermostat of rectangular cross-section and concluded:

The curvature is proportional to the difference in elongation of the two metals and inversely proportional to the thickness of the strip. It is seen that the magnitude of the ratio [of the Young's moduli of the two metals] does not produce any substantial effect on the curvature of the strip. See Timoshenko at page 235.

A bi-metallic strip 100 is provided in FIG. 1. Specifically, the bi-metallic strip 100 includes a first component 102 and a second component 104. The first component 102 is made of a different metal than the second component 104. The first component 102 and second component 104 have the same dimensions and different coefficients of linear expansion and moments of inertia. Heating the bi-metallic strip 100 causes bending of the bi-metallic strip 100.

Equations are provided below for calculating the temperature of buckling, the complete travel during buckling, and the temperature of buckling in a backward direction. By using these equations, the dimensions of the bi-metallic strip 100 for a given temperature of operation and a given complete range of temperature can be calculated. It has long been known that two sheets of metal with different coefficients of thermal expansion ("CTE") will bend with changes in temperature. The general relationship for the two metals (i.e., components 102 and 104) are of the same thickness (as provided by Timoshenko) is provided by Equation 1:

$$\frac{1}{\rho} = \frac{24(\alpha_2 - \alpha_1)(\Delta T)}{h\left(14 + n + \frac{1}{n}\right)} \quad \text{Equation (1)}$$

where the CTEs of the two materials are $\alpha_1$ (component 102) and $\alpha_2$ (component 104), the change in temperature is $\Delta T$, h is the combined thickness of components 102 and 104, n is the ratio of the mechanical moduli of components 102 and 104, the radius of curvature is $\rho$, and the "curvature" is $1/\rho$.

Note that Equation (1) can alternatively be expressed as Equation (2) below.

$$\frac{1}{\rho_{rect}} = \frac{6(\alpha_2 - \alpha_1)(t - t_0)(1 + m)^2}{h\left[3(1 + m)^2 + (1 + nm)\left(m^2 + \frac{1}{nm}\right)\right]} \quad \text{Equation (2)}$$

where $$\frac{1}{\rho_{rect}}$$

is the radius of curvature of the strip 100, h is the height or diameter of the fiber, $\alpha_2$ is the coefficient of thermal expansion for component 104, $\alpha_1$ is the coefficient of thermal expansion for component 102, n is the ratio of the Young's moduli of the components 102 and 104, and m is a ratio of the thickness of components 102 and 104. Note that setting m=1 in Equation (2) yields Equation (1).

According to the analysis in Timoshenko, the bending of the bonded metal sheets (i.e., components 102 and 104 combined) is not a strong function of the mechanical modulus of the component metals. $E_1$ and $E_2$ are the elastic moduli of components 102 and 104, respectively. It is seen that the magnitude of $$n = \frac{E_1}{E_2}$$

does not produce any substantial effect on the curvature of the strip. For example, when n=1, then Equation (1) above is reduced to Equation (3).

$$\frac{1}{\rho} = \frac{3(\alpha_2 - \alpha_1)(\Delta T)}{2h} \quad \text{Equation (3)}$$

where the CTEs of the two materials are $\alpha_1$ (component 102) and $\alpha_2$ (component 104), the change in temperature is $\Delta T$, h is the combined thickness of components 102 and 104, the radius of curvature is $\rho$, and the "curvature" is $1/\rho$.

Similarly, when n=½ or n=2 then Equation (1) is reduced to Equation (4) below.

$$\frac{1}{\rho} = \frac{48(\alpha_2 - \alpha_1)(\Delta T)}{33h} \quad \text{Equation (4)}$$

where the CTEs of the two materials are $\alpha_1$ (component 102) and $\alpha_2$ (component 104), the change in temperature is $\Delta T$, h is the combined thickness of components 102 and 104, the radius of curvature is $\rho$, and the "curvature" is $1/\rho$.

"For a ratio of Young's moduli of 2, the "difference . . . [in curvature] is only about 3 percent." See Timoshenko at page 236.

However, many combinations of materials that could be useful have mechanical moduli which can vary by a factor or ten or more. Based on these same equations the bending would be reduced by about one third. If the mechanical moduli differ by two orders of magnitude the bending is reduced to only 15% of the amount of bending that would be seen in the case where mechanical moduli are equal.

Examples of materials with very different mechanical moduli are polymers above and below their glass transition temperatures. Amorphous polymers above their glass transition temperature (i.e., in a rubbery state) usually have much higher CTEs than those below their glass transition temperature (i.e., in a glassy state) and would make good candidates for bending in response to temperature changes to act as a thermostat or a temperature adaptive insulation. Unfortunately, a decrease in modulus of about 3 orders of magnitude occurs at the glass transition making this combination of materials essentially useless.

Many materials of current technological interest such as gels, amorphous metals, shape memory polymers, and nanocomposites have mechanical moduli which vary by orders of magnitude limiting the combinations of materials that can be used.

However, for polymeric materials, the elastic modulus can change by three orders of magnitude below and above the glass transition temperature (Aklonis and McKnight, 1983). It is just such a combination of a polymer above its glass transition temperature and one below its glass transition temperature (or in a crystalline form) that gives the greatest difference in coefficients of thermal expansion.

The prior art (e.g., U.S. Pat. No. 4,115,620 issued Sep. 19, 1978) discloses an even polymer blend (i.e., extruded at 50:50 ratio).

Although U.S. Pat. No. 4,315,881 (issued Feb. 16, 1982) discloses that the ratio by weight of extruded fiber components is 30:70 to 70:30 and 40:60 to 60:40.

Generally, the prior art does not use the moments of inertia of the components to determine the ratio of those components (in an extruded material) and manipulate the shape of the extruded material to maximize bending.

Thus there is a need to use a wider selection of materials of significantly different mechanical moduli. There is also a need to tailor the moments of inertia of at least two components, in an actuator, to enhance or suppress bending.

SUMMARY

To the knowledge of the present inventors, the prior art does not adjust the ratio of two components to optimize bending. Further, the prior art does not appear to use or manipulated these ranges to optimize bending of extruded material.

Embodiments of the present invention generally relate to actuators and more specifically to tailoring the moments of inertia of at least two components, of the actuator, to enhance or suppress bending.

For example, in one embodiment, a method is provided that acquires a first ratio of a modulus of inertia for a first component to a Young's Modulus for the first component. The method also acquires a second ratio of a modulus of inertia for a second component to a Young's Modulus for the second component. Thereafter, the method provides an actuator (which includes the first component and second component). The actuator has a cross-sectional shape such that the first ratio is substantially equal to said second ratio.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, similar reference numerals have been used, wherever possible, to designate identical elements that are common to the figures.

DETAILED DESCRIPTION

Figure 1:
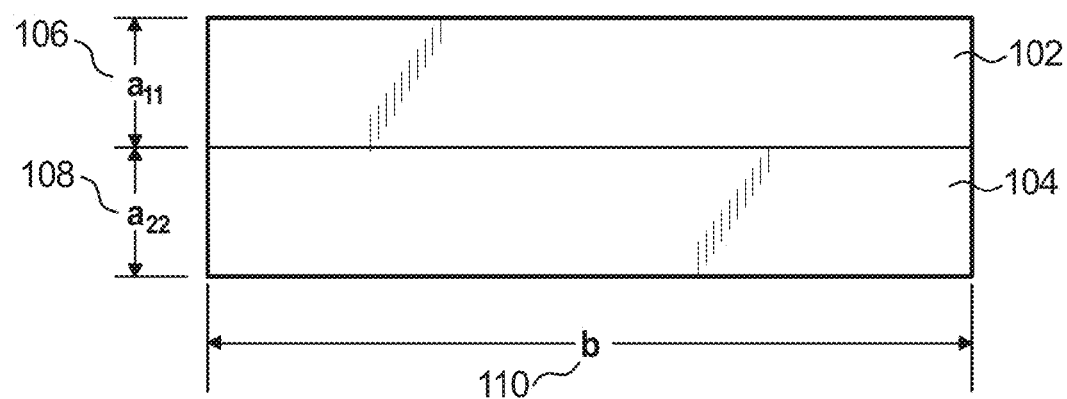
FIG. 1 depicts a bi-metal spring in accordance with the prior art.

In the following description, numerous specific details are set forth to provide a more thorough understanding of the invention. As will be apparent to those skilled in the art, however, various changes using different configurations may be made without departing from the scope of the invention. In other instances, well-known features have not been described in order to avoid obscuring the invention. Thus, the invention is not considered limited to the particular illustrative embodiments shown in the specification and all such alternate embodiments are intended to be included in the scope of the appended claims.

In short, embodiments of the invention make the ratio of the moment of inertia to the Young's Moduli for a first component equal to the ratio of the moment of inertia to the Young's Moduli for a second component. One way to make the two ratios equal is to provide a shape (i.e., the ratio) for the combination of the two components such that there is less of one component than the other component. Exemplary shapes are provided in FIGS. 2 and 3. It is to be understood that the shapes provided herein are for illustrative purposes only and not intended to limit the scope of the invention (i.e., limit the invention to the exemplary shapes).

Some of the commercial applications of embodiments of the invention include, but are not limited to, temperature adaptive insulation, stimuli responsive textiles, self-tightening sutures and switches/thermostats.

For illustrative purposes only, aspects of the invention are described herein as maximizing the bending of the actuators. However, these descriptions are not intended to limit the invention in any way. For example, aspects of the invention also include limiting the bending of the actuators.

For illustrative purposes only, aspects of the invention are described herein using polymers. However, these descriptions are not intended in any way to limit the scope of the invention nor are they intended to limit the scope of the materials which can be used.

One application of the invention is an adaptive thermal insulation for clothing and equipment that provides greater insulation at low temperatures and less at high temperatures. Clothing that adapts to changes in environmental conditions means that fewer items will be required to effectively protect soldiers or civilians over a wide range of operating temperatures.

For illustrative purposes only, embodiments of the invention are described herein with respect to temperature adaptive insulation. For example, soldiers must adapt their clothing to a wide variety of weather and climate conditions. This often means adding or subtracting garments and providing more or less ventilation by using openings in the clothing. The insulation required for thermal balance can change rapidly especially in mountainous regions as soldiers move from one altitude to another or encounter climatic variables. If the insulation level is too low it may result in hypothermia or frostbite leading to degraded performance (loss of dexterity and fine motor control). If the insulation level is too high it can result in unnecessary sweating which collects within the insulation, degrading the insulation and increases water consumption, which in turn may lead to dehydration.

Although the term "extrusion" is used herein that use is for illustrative purposes only and not intended, in any way, to limit the scope of the invention. For example, in various embodiments, compounds are bonded, secured, attached, or coupled to each other.

Figure 2:
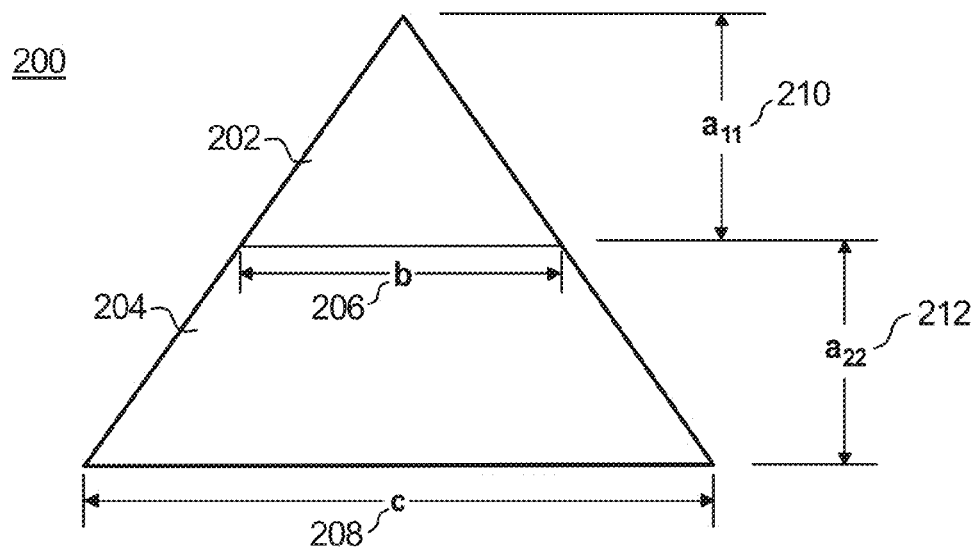
FIG. 2 depicts a first embodiment of the invention.

In aspects of the invention, moments of inertia of the components are tailored such that the response of materials with very different mechanical moduli is accommodated. As an example, one implementation of this is a bi-component fiber of triangular cross section (depicted in FIG. 2). In FIG. 2, a first component 202 is depicted as the "top" of the triangular shaped extrusion 200 while the second component 204 is the "bottom" of the triangular shaped extrusion 200 (note that the second component 204 has a trapezoidal shape).

Experimentally it is found that considerably greater bending can be seen in configurations with the first component 202 composed of a higher modulus material than the second compound 204 (rather than a reverse configuration with the second compound 204 on top).

FIG. 2 also depicts a length ("b") of one dimension 206 of first component 202 and a length ("c") of one dimension 208 of second component 204. First component 202 and second component 204 include heights $\alpha_{11}$ and $\alpha_{22}$, respectively. The curvature for triangular cross section 200 is provided in Equation (5), as follows:

$$\frac{1}{\rho_{tri}} = \frac{18(\alpha_2 - \alpha_1)(t - t_0)(1 + m)^2}{h\left\{9(1 + m)^2 + 2(1 + m)\left[(m^2 + 1)(1 - a_1) + \frac{2(a_1 - a_1^2)}{(a_1 + 1)^2} + m^3 \frac{(a_1 - a_1^2)}{(a_1 + 1)} + \frac{1}{n}\frac{(a_1^2 + 4a_1 + 1)(1 - a_1)}{m(a_1^2 + a_1)}\right]\right\}}$$

where $$\frac{1}{\rho_{tri}}$$

is the radius of curvature of the triangular cross-section 200, h is the total height or diameter of the components 202 and 204, $\alpha_2$ is the coefficient of thermal expansion for component 204, $\alpha_1$ is the coefficient of thermal expansion for component 202, n is the ratio of the Young's moduli of the components 202 and 204, m is a ratio of the thickness of components 202 and 204, $\alpha_1$ is the height of the component 202, and $\alpha_2$ is the height of component 204. Note that $\alpha_1 + \alpha_2 = 1$ and that $\alpha_2 = 1 - \alpha_1$ has been substituted into Equation (5).

Calculation of the moment of inertia for first component 202 is provided by Equation (6).

$$I_1 = \frac{a_{11}^3 b}{36} \quad \text{Equation (6)}$$

where $I_1$ is the moment of inertia for first component 202, $\alpha_{11}$ is the height of the first component 202, and b is the length of one of the dimensions (i.e., the base) of the first component 202.

Calculation of the moment of inertia for the second component 204 is provided by Equation (7).

$$I_2 = \frac{a_{22}^3(b^2 + 4bc + c^2)}{36(b + c)} \quad \text{Equation (7)}$$

where $I_2$ is the moment of inertia for second component 204, $\alpha_{22}$ is the height of the second component 204, and b and c are lengths of the upper and lower sides (of the trapezoid) of the second component 204.

Equation (7) is simplified to Equation (8) when m=1.

$$\frac{1}{\rho_{tri}} = \frac{72(\alpha_2 - \alpha_1)(t - t_0)}{h\left[41 + \frac{2}{3}n + \frac{26}{3}\frac{1}{n}\right]} \quad \text{Equation (8)}$$

where $$\frac{1}{\rho_{tri}}$$

is the radius of curvature of the triangular shaped extrusion 200, h is the total height of the triangular shaped extrusion 200, $\alpha_2$ is the coefficient of thermal expansion for component 204, $\alpha_1$ is the coefficient of thermal expansion for component 202, n is the ratio of the Young's moduli of the components 202 and 204.

Figure 3:
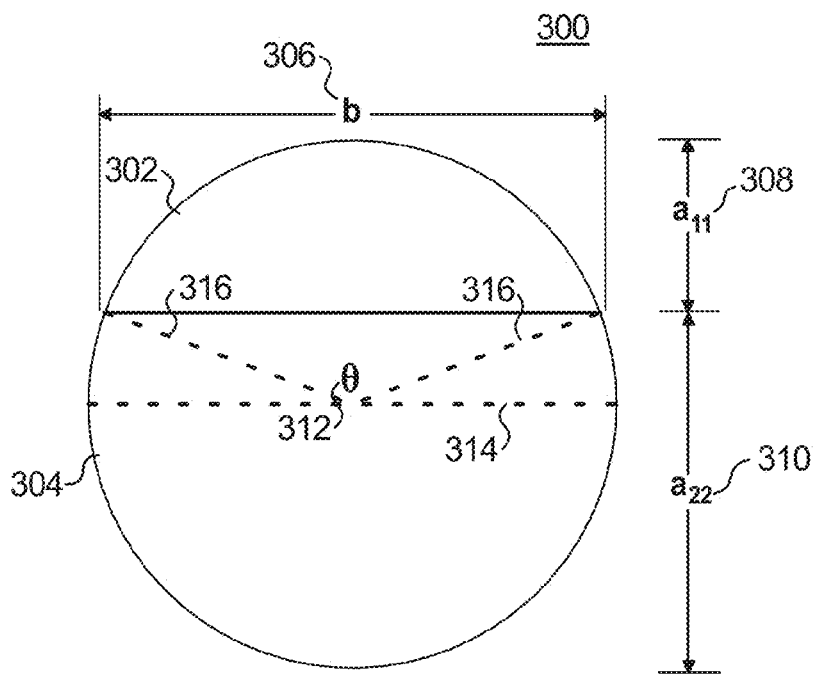
FIG. 3 depicts a second embodiment of the invention.

FIG. 3 depicts another embodiment 300 of the invention. Specifically, FIG. 3 depicts a substantially circular shaped cross-section 300. The substantially circular shaped cross-section 300 includes a first component 302 (at an upper portion of the cross-section 300) and a second component 304 (at a lower portion of the cross-section 300).

The first component 302 includes a height 308 ($\alpha_1$) and a dimensional length 306 (b). The second component 304 includes a height 310 ($\alpha_{22}$). Extrusion 300 includes a diameter 314 (depicted in dashed lined). Angle θ 312 is taken from the diameter 314 (and center of cross-section 300) and is the angle formed between the diameter 314 and dashed lines 316 extending from the center of the extrusion 300 to the ends of dimensional length 306.

The curvature for circular shaped cross-section 300 is provided below in Equation (9), (10), (11), and (12) (when components 302 and 304 are of unequal height).

$$X = \frac{(\theta - \sin\theta)}{2} \quad \text{Equation (9)}$$

where X is used as a substitution to simplify Equation (12).

$$F = \pi - \frac{(\theta - \sin\theta)}{2} \quad \text{Equation (10)}$$

where F is used as a substitution to simplify Equation (12).

$$k = \frac{A_1}{A_2} \quad \text{Equation (11)}$$

where $A_1$ represents the cross-sectional area of the first component 302 and $A_2$ represents the cross-sectional area of the second component 304.

$$\frac{1}{\rho_{circ}} = \frac{2XF(\alpha_2 - \alpha_1)(t - t_0)(1 + m)^2}{h\left\{XF + [n(BX - C) + k(BF - C)]\left(\frac{1}{nk+1}\right)\right\}} \quad \text{Equation (12)}$$

where $$\frac{1}{\rho_{circ}}$$

is the radius of curvature of the circular cross-section 300, h is the total height or diameter of the circular cross-section 300, $\alpha_2$ is the coefficient of thermal expansion for component 304, $\alpha_1$ is the coefficient of thermal expansion for component 302, n is the ratio of the Young's moduli of the components 302 and 304, m is a ratio of the thickness of components 302 and 304, X is provided by Equation (9), F is provided by Equation (10), k is the ratio of cross-sectional areas of the first component 302 to the second component 304, and B and C are functions of the geometry of the circle and are used as a substitute for variables to simply Equation (12).

Equation (12) can be simplified to Equation (13) when m=1.

$$\frac{1}{\rho_{circ}} = \frac{\frac{\pi}{2}(\alpha_2 - \alpha_1)(t - t_0)}{h\left[\left(\frac{\pi^2}{8} - \frac{8}{9}\right) + \left(\frac{\pi^2}{16} - \frac{4}{9}\right)n + \left(\frac{\pi^2}{16} - \frac{4}{9}\right)\frac{1}{n}\right]} \quad \text{Equation (13)}$$

where $$\frac{1}{\rho_{circ}}$$

is the radius of curvature of the circular cross-section 300, h is the total height or diameter of the circular cross-section 300, $\alpha_2$ is the coefficient of thermal expansion for component 304, $\alpha_1$ is the coefficient of thermal expansion for component 302, n is the ratio of the Young's moduli of the components 302 and 304, and m is a ratio of the thickness of components 302 and 304.

Embodiments of the invention use the ratio of the moment of inertia to the Young's Moduli for a first component equal to the ratio of the moment of inertia to the Young's Moduli for a second component to create shaped fibers that bend in response to temperature. The shaped fibers are multi-component fibers (e.g., bi-component or tri-component fibers). Multi-component spinning can be used as a cost effective way of producing large quantities of fibers that bend as the temperature changes.

One way to use such fibers is to create a loose mat or batting. Battings are commonly used as insulation in, for example, jackets and sleeping bags. In various embodiments, the polymeric fibers (e.g., bi-component or tri-component polymeric fibers having circular or triangular cross-sections) are used to provide insulation which changes thickness in response to temperature. The polymeric fibers have at least two components with different coefficients of thermal expansion (CTE). As the temperature changes, polymeric fibers are temperature responsive and curl as the temperature is decreased. Curling of the polymeric fibers (in response to the decrease temperature) causes the insulation thickness to increase providing greater thermal insulation.

As indicated above, bi-component and tri-component fibers can be spun from commercially available polymers of widely differing coefficients of thermal expansion. Some combination of polymers and fiber geometry results in changes of more than two orders of magnitude (>1.5×10$^{-2}$ per °C.).

Fibers can be spun to create a temperature adaptive thermal insulation using a tri-component fiber extruder. One of the purposes of a third component (depicted in FIG. 7) is to limit the interfacial shear between the high and low CTE components.

In some embodiments of the invention, thickness changes by more than 1.5% per °C. (30% over a temperature range from approximately 20°C. to 0°C.).

Figure 4:
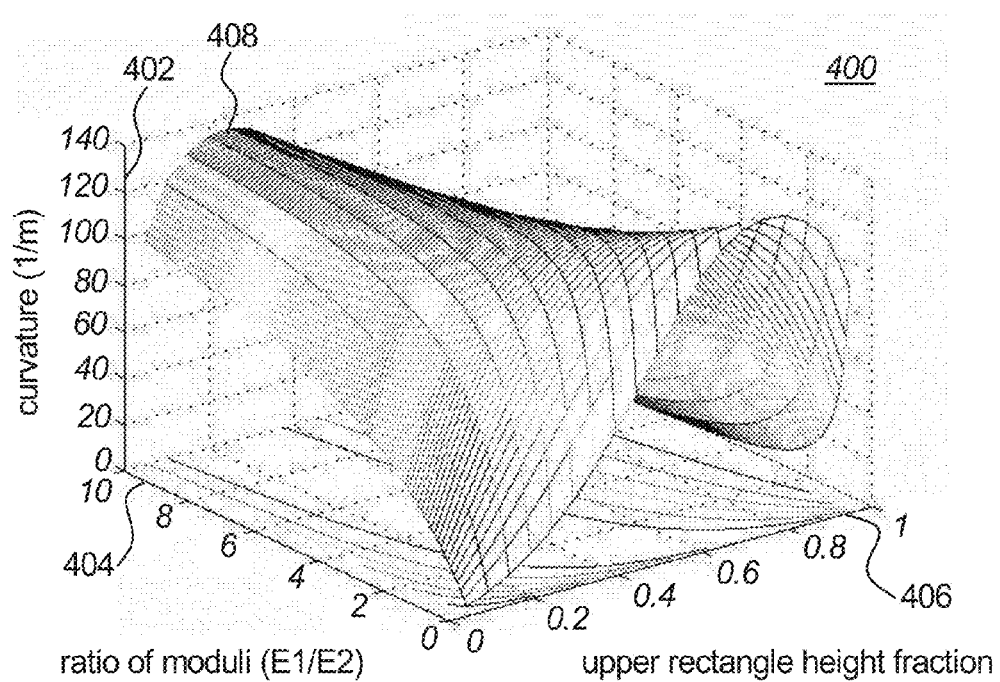
FIG. 4 depicts a graph of the temperature response (i.e., curvature) using a polymer having a rectangular shaped cross-section.

FIG. 4 depicts a plot 400 of the temperature response (i.e., curvature) using Equation (1). Specifically, graph 400 includes a curvature 402 (parallel to a "Z axis"), a ratio of moduli $$\left(\frac{E_1}{E_2}\right)$$

404 (parallel to a "Y axis"), and an upper rectangle height fraction 406 (parallel to an "X axis"). The graph 400 depicts plot 408 which shows that when the ratio of the moduli are equal to 1 then the optimum bending occurs at 50% of each component. The maximum bending at any ratio of the moduli 404 from 0.1-10 is different depending upon the composition of the fiber.

Figure 5:
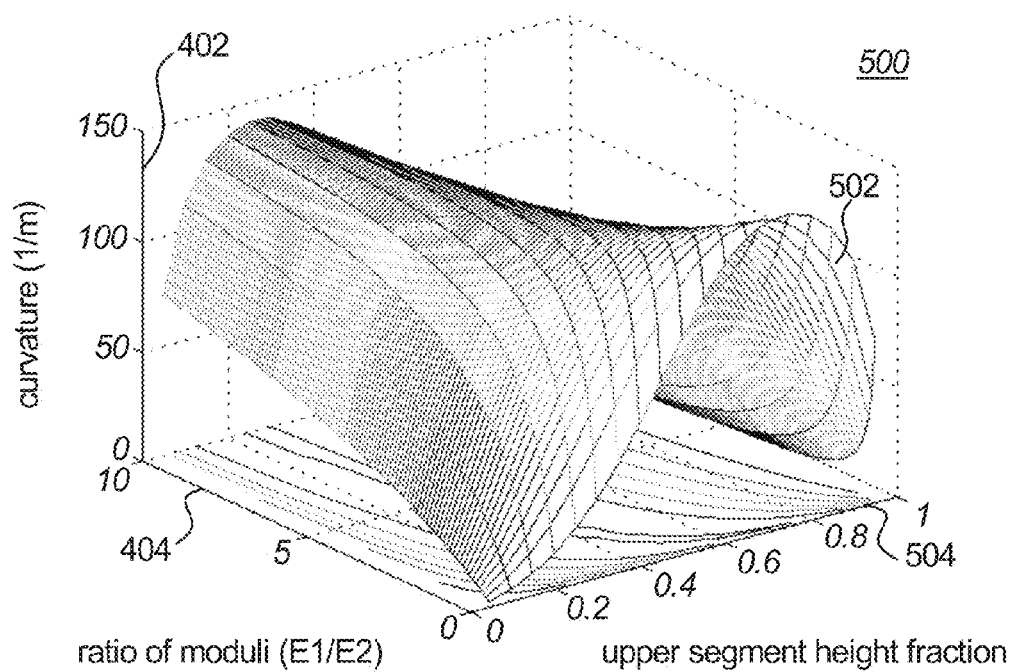
FIG. 5 depicts a graph of the temperature response for a polymer having a circular cross-section in accordance with embodiments of the invention.

FIG. 5 shows a graph 500 of the temperature response for a series when the area fraction of the base of the triangle is systematically varied. Specifically, graph 500 includes a curvature 402 (parallel to a "Z axis"), a ratio of moduli $$\left(\frac{E_1}{E_2}\right)$$

404 (parallel to a "Y axis"), and an upper segment height fraction 504 (parallel to an "X axis"). The graph 500 depicts plot 502 which shows that when compared to a rectangular cross-section (e.g., in the plot 408), a circular cross-section provides a potential for greater bending of the fiber (in various embodiments) and greater suppression of bending of the fiber (in other embodiments). In addition, plot 502 also shows that the components used can be at a higher ratio of the moduli than taught in the prior art.

Figure 6:
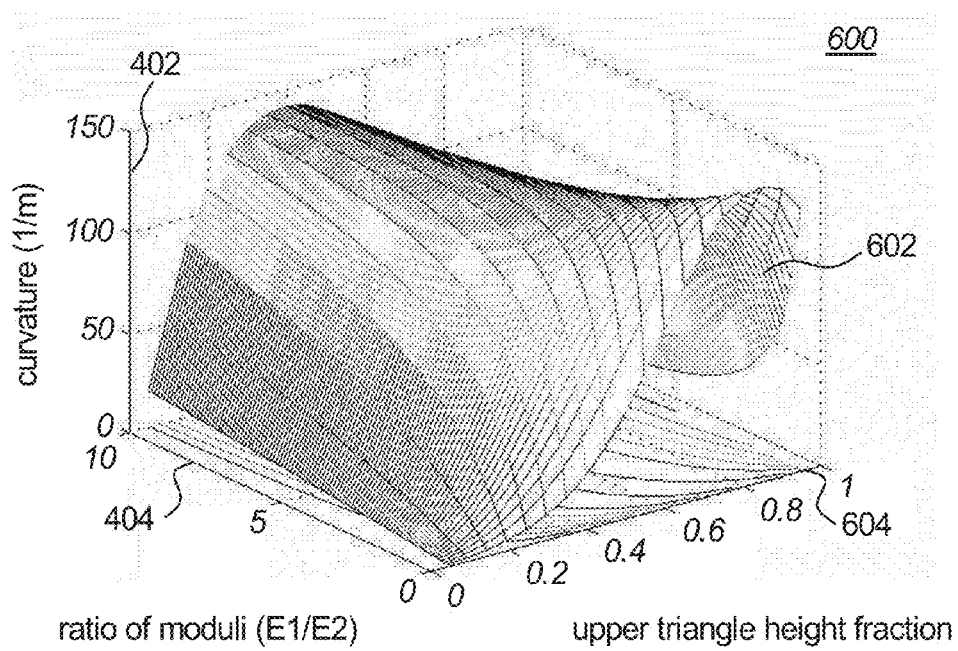
FIG. 6 depicts a graph of the temperature response for a systematically varied area fraction of the base of the triangle in accordance with embodiments of the invention.

FIG. 6 depicts a graph 600 of the temperature response for a systematically varied area fraction of the base of the triangle in accordance with embodiments of the invention. Specifically, graph 600 includes a curvature 402 (parallel to a "Z axis"), a ratio of moduli $$\left(\frac{E_1}{E_2}\right)$$

404 (parallel to a "Y axis"), and an upper triangle height fraction 604 (parallel to an "X axis"). The graph 600 depicts plot 602 which shows that when compared to a rectangular cross-section (e.g., in the plot 408) a triangular shaped cross-section provides a potential for greater bending of the fiber (in various embodiments) and greater suppression of bending of the fiber (in other embodiments). In addition, plot 602 also shows that the components used can be at a higher ratio of the moduli than taught in the prior art.

It appears from plot 604 that the batting response is greater for decreasing area fraction of the bottom section (i.e., second component 204) of a triangular shaped cross-section of a fiber. The results are consistent with the analytical model. Some fiber samples show a change in the thickness of 1.8% per ° C. while the lowest response is about 0.3% or less. In some embodiments, an area fraction of 0.3 is the approximate lower limit for the fiber spinning apparatus. Plot 604 indicates an optimum response at a level that is a function of the ratio of the mechanical moduli of the components in a two component system.

In various embodiments of the invention, isotactic and syndiotactic polypropylene (i-PP, s-PP) are the components used in the fibers. The isotactic polymer is of a relatively high crystallinity and has a relatively high modulus and low coefficient of thermal expansion. In contrast, the syndiotactic polymer crystallizes slowly and is expected to have a high CTE and a low modulus.

Values for polypropylene can be taken from Uehara, H., Yamazaki, Y. and Kanamoto, T. Tensile Properties of Highly Syndiotactic Polypropylene. 1996, Vol. 37, 1, pp. 57-64 (hereinafter "Uehara") for calculation and comparison of values obtained during testing. For example, drawn isotactic polypropylene presumed to have a fiber modulus of 20 GPa while well drawn syndiotactic polypropylene had a fiber modulus of 3 GPa—a ratio of 6.67- to-1. A typical CTE for an amorphous polymer is around $10^{-4}$ m/m ° C. Crystalline and highly oriented polymeric fibers can have a negative CTE along the length of the fiber. The chain axis CTE for isotactic PP crystals is negative, $-1 \times 10^{-5}$ m/m ° C. [7].

In various embodiments of the invention, fibers are spun from commercial grades of polypropylene. In various embodiments, spun fibers have an edge length of approximately about 50 microns. In various embodiments, fibers are spun with a draw ratio of about 2.5-to-1 and collected onto rolls of about 15 cm diameter. Crystalline and highly oriented polymeric fibers can have a negative CTE along the length of the fiber. The chain axis CTE for isotactic PP crystals is negative, $-1 \times 10^{-5}$ m/m ° C.

In various embodiments, the CTE and modulus in the fiber direction of each component is a function of the level of crystallinity and the orientation of the crystal, amorphous and intermediate phases.

Figure 7:
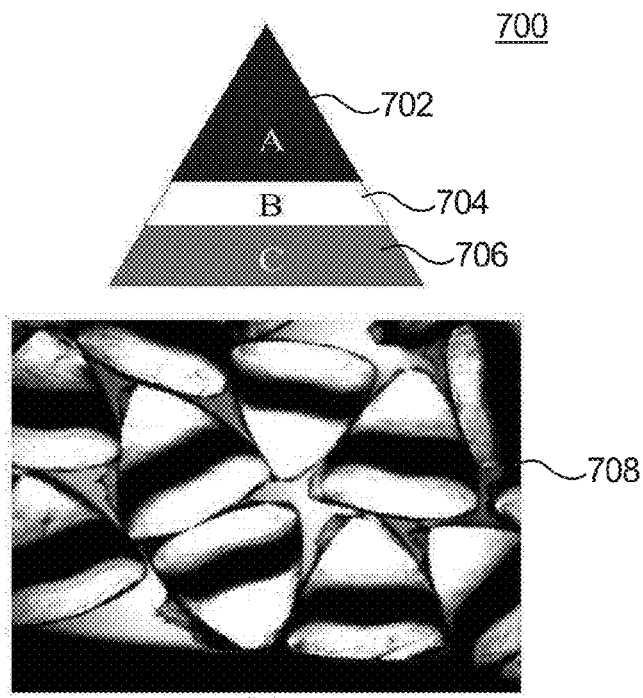
FIG. 7 depicts a triangular cross-section of a fiber in accordance with embodiments of the invention.

FIG. 7 depicts a triangular cross-section of a fiber 700 in accordance with embodiments of the invention. The fiber 700 includes a first component 702, a center section 704, and a second component 706.

In various embodiments, the first component 702 is s-PP, the second component 706 is i-PP, and the center section 704 includes a small amount of dye added to a random ethylene propylene copolymer (co-EP) with a low modulus to limit interfacial stress between the first component 702 and the second component 706 but with a coefficient of thermal expansion similar to s-PP.

In various embodiments, a high modulus polymer of the second component 706 provides a modulus ratio of 1/6.67 or 0.15. From the equations above (e.g., Equations (5), (6), (7), and (8)), for a system with this modulus ratio, the maximum curvature is predicted to occur when the fraction of the first component 702 is between about 0.8 and about 0.85 (second component fraction between about 0.2 and about 0.15). A micrograph 708 of actual fibers is also depicted in FIG. 7. "Table 2" below provides examples of fibers (e.g., Fiber 1) and component ratios.

TABLE 2

| | polymer/area fraction of each polymer | | |
|---|---|---|---|
| Fiber | A (s-PP) | B (co-EP) | C (i-PP) |
| 1 | 0.5 | 0.2 | 0.3 |
| 2 | 0.45 | 0.2 | 0.35 |
| 3 | 0.40 | 0.20 | 0.40 |
| 4 | 0.35 | 0.20 | 0.45 |
| 5 | 0.30 | 0.20 | 0.50 |

Fibers cut from rolls spontaneously curled to form batting. The curling is the result of relaxation of stresses from the spinning process and the change in length as the fibers are cooled from the spinning temperature.

The battings can then be die cut into samples for testing (e.g., cut into about 20 in$^2$ (129 cm$^2$) circular samples). The thickness of the samples can be measured in a temperature controlled chamber by compressing the samples with a pressure of about 0.02 psi. The thickness of the samples can first be measured at room temperature then in an environmental chamber cooled to zero ° C.

Figure 8:
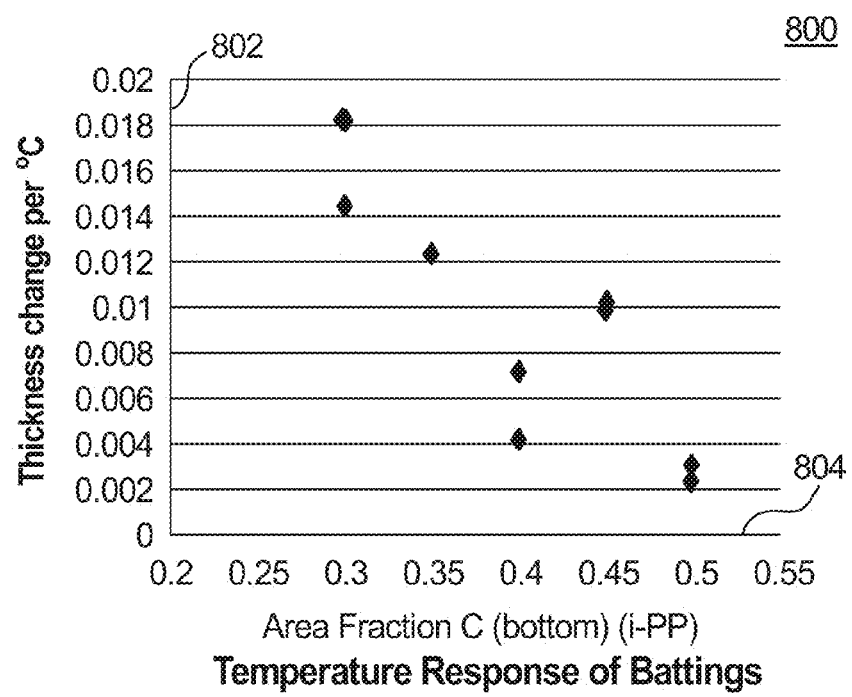
FIG. 8 depicts a plot of a temperature response for an exemplary cross-section of an actuator in accordance with embodiments of the invention.

FIG. 8 depicts a plot 800 of a temperature response for an exemplary cross-section of an actuator in accordance with embodiments of the invention. Specifically, FIG. 8 shows the change in thickness of batting per ° C. 802 (parallel to the "Y-axis") where the area fraction of the base of the triangle 804 (parallel to the "X-axis") is systematically varied. The results are consistent with the analytical model. For example, FIG. 8 depicts a change in thickness of 1.8% per degree C. while the lowest response is about 0.3% or less. An area fraction of about 0.3 is the approximate lower limit for the fiber spinning apparatus.

An analysis of the thermally-induced curvature of bi-component fibers of various cross-sections with respect to the ratio of the moduli of the components and the fraction of the cross-section that each component occupies is provided. Graphical analysis of these functions supports qualitatively that to achieve maximum curvature of the fibers, the design space of interest resides along the "spine" of the surfaces. Quantitatively, the functions allow the proportions of the components to be selected to maximize the fiber curvature for a given pair of polymers. Experimental fibers of varying component fractions are spun, formed into mats and their thickness measured at various temperatures. The experimentally measured thickness changes are in good agreement with the analytical results for fiber bending. Based on a one dimensional heat transfer model the change in thickness appears to be sufficient for a practical adaptive thermal insulation.

Figure 9:
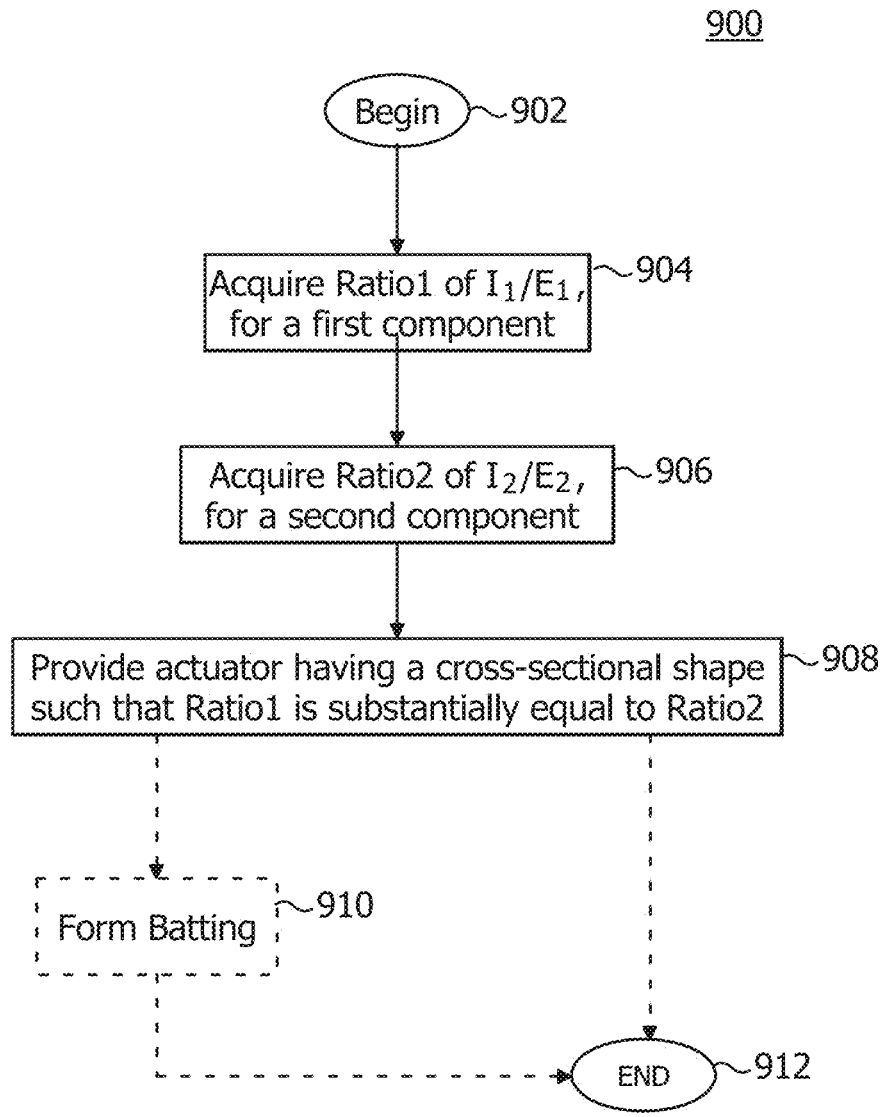
FIG. 9 depicts an embodiment of a method in accordance with embodiments of the invention.

FIG. 9 depicts an embodiment of a method 900 in accordance with embodiments of the invention. The method 900 begins at step 902 and proceeds to step 904.

At step 904, a ratio (i.e., "Ratio1") is determined between the moment of inertia and the Young's modulus for a first component. Thereafter, the method 900 proceeds to step 906.

At step 906, a ratio (i.e., "Ratio2") is determined between the moment of inertia and the Young's modulus for a second component. Thereafter, the method 900 proceeds to step 908.

At step 908, an actuator is formed (e.g., spun fibers or adhesion) using the first component and the second component. The amounts of the first component and the second component that are used are determined by Ratio1 and Ratio2. The amount of each component is adjusted until the ratios I/E (of each component) are the same. So that Ratio1 and Ratio2 are substantially equal, the actuators can have non-rectangular shapes (i.e., shapes where the dimensions of the first component are not equal to the dimensions of the second component) (e.g., triangular or circular). After formation of the actuators, the method 900 proceeds to and ends at step 912.

In various embodiments, the method 900 proceeds to optional step 910. At optional step 910 the actuators (when the actuators are spun fibers) are formed into batting. After optional step 910, the method proceeds to and ends at step 912.

Figure 10:
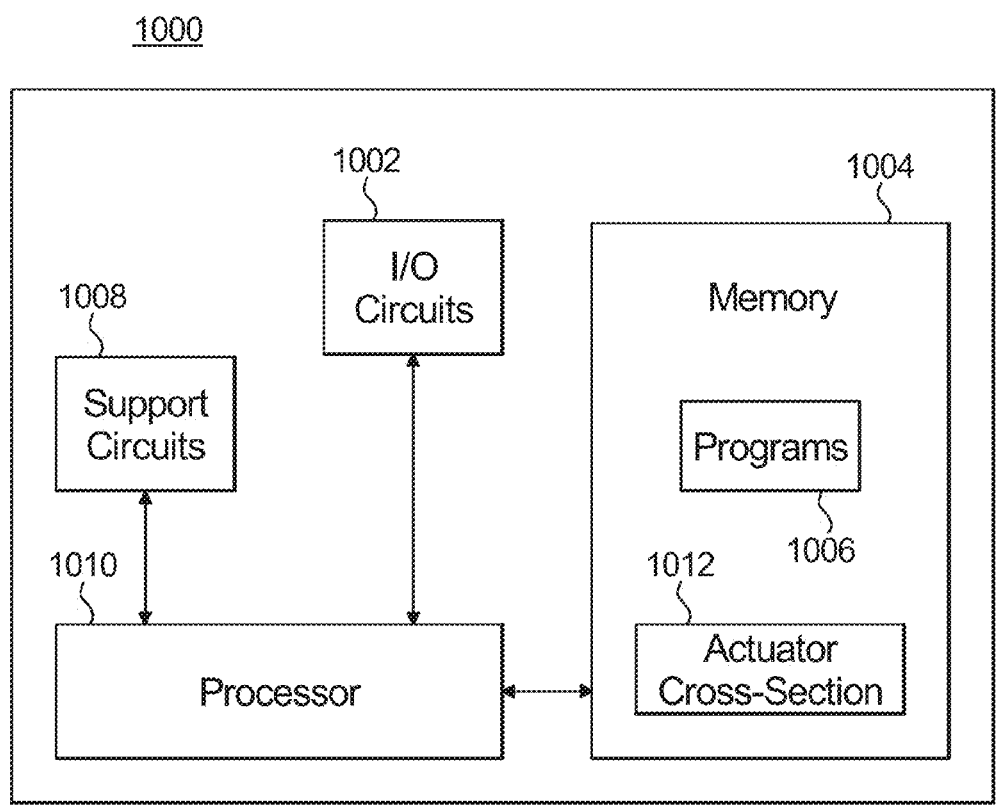
FIG. 10 depicts an embodiment of a high-level block diagram of a general-purpose computer architecture for providing an actuator in accordance with embodiments of the invention.

FIG. 10 depicts an embodiment of a high-level block diagram of a general-purpose computer architecture 1000 for an actuator in accordance with embodiments of the invention. For example, the general-purpose computer 1000 is suitable for use in performing the method of FIG. 9. The general-purpose computer of FIG. 10 includes a processor 1010 as well as a memory 1004 for storing control programs and the like. In various embodiments, memory 1004 also includes programs (e.g., depicted as an "actuator cross-section" 1012 for creating actuators having a cross-sectional shape such that a ratio of the moment of inertia to Young's modulus for a first component is substantially equal to the moment of inertia to Young's modulus for a second component) for performing the methods and for producing the embodiments described herein. The processor 1010 cooperates with conventional support circuitry 1008 such as power supplies, clock circuits, cache memory and the like as well as circuits that assist in executing the software routines 1006 stored in the memory 1004. As such, it is contemplated that some of the process steps discussed herein as software processes can be loaded from a storage device (e.g., an optical drive, floppy drive, disk drive, etc.) and implemented within the memory 1004 and operated by the processor 1010. Thus, various steps and methods of the present invention can be stored on a computer readable medium. The general-purpose computer 1000 also contains input-output circuitry 1002 that forms an interface between the various functional elements communicating with the general-purpose computer 1000.

Although FIG. 10 depicts a general-purpose computer 1000 that is programmed to perform various control functions in accordance with the present invention, the term computer is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein. In addition, although one general-purpose computer 1000 is depicted, that depiction is for brevity only. It is appreciated that each of the methods described herein can be utilized in separate computers.

Figure 11:
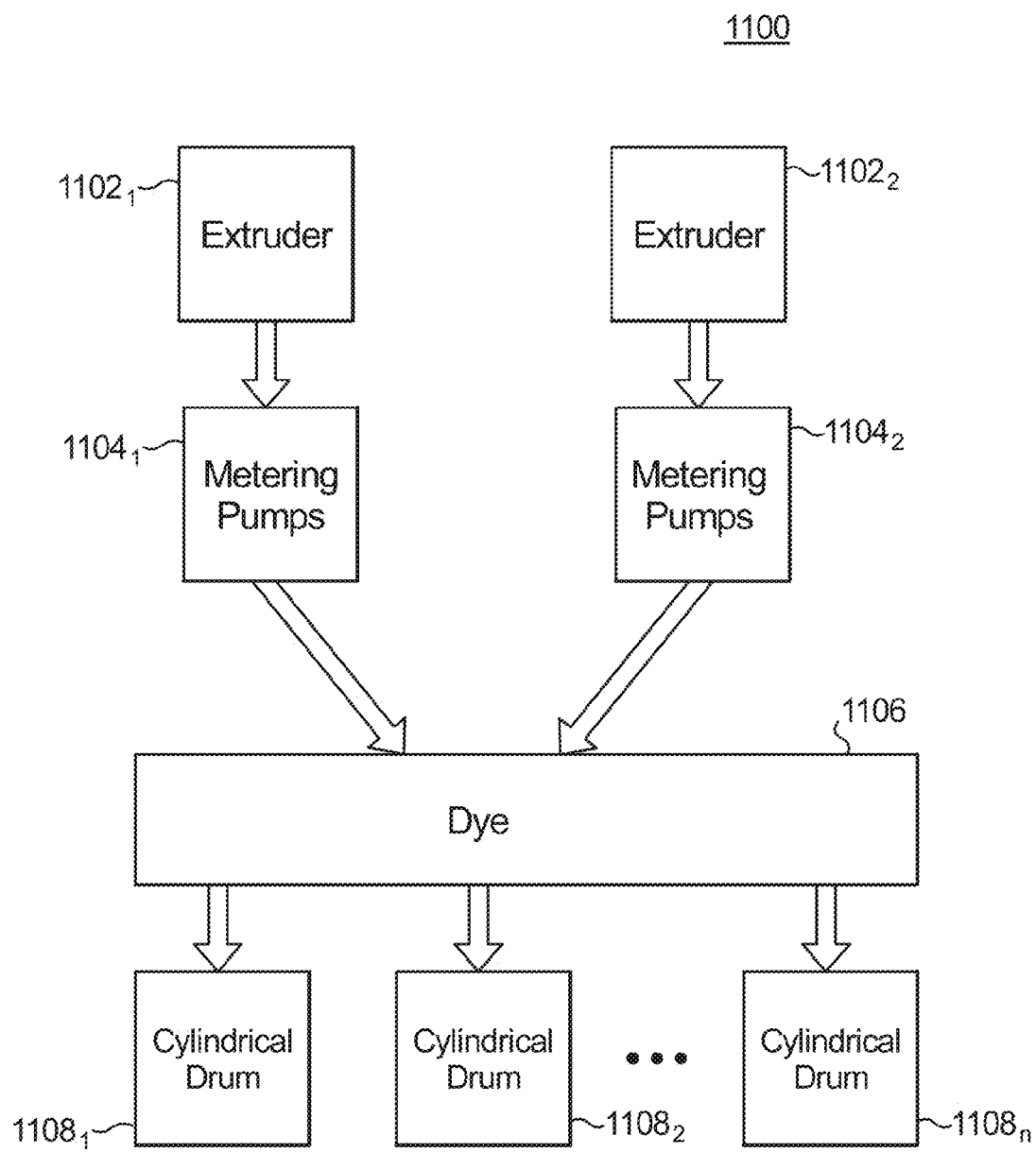
FIG. 11 depicts an embodiment of a system in accordance with embodiments of the invention.

FIG. 11 depicts an embodiment of a system 1100 in accordance with embodiments of the invention.

The system 1100 includes an extruder $1102_1$ and extruder $1102_2$. Each of the extruders $1102_1$ and $1102_2$ are adapted to receive a different component (e.g., one polymer is poured into extruder $1102_1$ and a different polymer is poured into extruder $1102_2$). Illustratively, the polymer poured into extruder $1102_1$ is one of isotactic polypropylene, a polyethyleneterephthalate (PET) and polyester; and the polymer poured in extruder $1102_2$ is one of an amorphous polymer, a syndiotactic polypropylene, and a polycarbonate. After polymers are poured into the extruders 11021 and 11022, the extruders 11021 and 11022 melt the polymers.

After the polymers melt, the extruders $1102_1$ and $1102_2$ force the polymers through metering pumps $1104_1$ and $1104_2$. Each metering pumps $1104_1$ and $1104_2$ regulate the amount of melted polymer that passes through the metering pump $1104_1$ and $1104_2$ to a dye 1106. A ratio of a modulus of inertia to a Young's Modulus for each component (illustratively referred to hereinafter as the "first ratio" and "second ratio" respectively) is acquired. The metering pumps $1104_1$ and $1104_2$ regulate the amount of each polymer that passes through the dye 1106. The dye 1106 has an internal periphery which shapes and combines the two polymers. The metering pumps $1104_1$ and $1104_2$ regulate the amount of polymer passing through each respective pump such that the amount extruded through the dye 1106 results in the first ratio being substantially equal to the second ratio. In addition, the internal periphery (of the dye 1106) forces an actuator (not shown) (i.e., a combination of the two polymers) passing through the dye 1106 to have the internal periphery of the dye 1106. The resulting actuator has a cross-sectional shape (e.g., a triangular cross-section or a substantially circular cross-section) where the first ratio is substantially equal to said second ratio.

After an actuator is formed (i.e., as fibers), the fibers are spun onto cylindrical drum $1108_1$. In various embodiments, the system 1100 includes multiple cylindrical drums $1108_1$, $1108_2$, . . . and $1108_n$.

Illustratively, FIG. 11 depicts a bi-component extruder. However, that depiction is not intended in any way to limit the scope of the invention. For example, embodiments of the invention can be used in conjunction with tri-component extruders.

In various embodiments of the invention can be utilized with Micro-Electro-Mechanical-Systems ("MEMS"). Embodiments of the invention can be used to design/build actuators by machining, Computer Numerical Controlled machining ("CNC"), and micromachining processes. Even at the micron or nanometer level aspects of the invention can be used to make an actuator.

As used herein, the terms "having," "containing," "including," "comprising" and the like are open ended terms that indicate the presence of stated elements or features, but do not preclude additional elements or features. The articles "a," "an," and "the" are intended to include the plural as well as the singular, unless the context clearly indicates otherwise. The term "acquiring" is an open ended term that can mean any way of obtaining the characteristics, including measuring, looking up in a handbook, checking with a manufacture of material, estimating from theoretical calculations, and/or a physical measurement.

While the foregoing is directed to embodiments of the present invention, other and further embodiments of the invention may be devised without departing from the basic scope thereof, and the scope thereof is determined by the claims that follow.

We claim:

1. A method for configuring an actuator to bend a predetermined amount for a change in ambient conditions, comprising:
    determining a desired amount of bending for an actuator based on ambient conditions;
    selecting a first component having a first ratio of a modulus of inertia to a Young's Modulus for said first component;
    selecting a second component having a second ratio of a modulus of inertia to a Young's Modulus for said second component; and
    combining said first component with said second component to form the actuator wherein said actuator includes a cross-sectional shape having said first ratio substantially equal to said second ratio; and
    whereby the actuator is configured to bend the desired amount for a change in ambient conditions.

2. The method of claim 1 wherein said combining comprises one of extruding, machining, spinning, adhering, and cross-linking of said first component and said second component.

3. The method of claim 1 wherein said actuator is a spun fiber.

4. The method of claim 3 further comprising forming a batting from said spun fiber.

5. The method of claim 1 wherein said cross-sectional shape is one of a triangular cross-section and a substantially circular cross-section.

6. The method of claim 1 further comprising forming said actuator into one of a suture, a batting, a thermostat needle, and a gel.

7. A method for making an actuator that is configured to bend a predetermined amount for a change in ambient conditions, comprising:
    determining a desired amount of bending for an actuator based on ambient conditions;
    selecting a first polymer for injecting through a dye, wherein said first polymer has a first coefficient of thermal expansion (CTE), and a first ratio of a modulus of inertia to a Young's Modulus, and
    selecting a second polymer for injecting, simultaneously to said injection of said first polymer, through said dye, wherein
    said second polymer has a second CTE higher than said first CTE, and a second ratio of a modulus of inertia to a Young's Modulus; and
    extruding the actuator from said dye, wherein said actuator includes a cross-sectional shape having said first ratio substantially equal to said second ratio and whereby the actuator is configured to bend the desired amount for a change in ambient conditions.

8. The method of claim 7 further comprising forming said actuator into one of one of a suture, a batting, and a gel.

9. The method of claim 7 wherein said first polymer is one of an isotactic polypropylene, a polyethyleneterephthalate (PET) and polyester.

10. The method of claim 7 wherein said second polymer is one of an amorphous polymer, a syndiotactic polypropylene, and a polycarbonate.

11. The method of claim 7 wherein said dye has one of a triangular cross-sectional shape and a substantially circular cross-sectional shape.

12. The method of claim 7 wherein said actuator is a spun fiber with a draw ratio of about 2.5 to about 4.5.

* * * * *